(12) United States Patent
Yang et al.

(10) Patent No.: US 11,340,523 B2
(45) Date of Patent: May 24, 2022

(54) CORRECTION METHOD OF PHOTOMASK PATTERN

(71) Applicant: XIA TAI XIN SEMICONDUCTOR (QING DAO) LTD., Qingdao (CN)

(72) Inventors: Siwon Yang, Singapore (SG); Jiyong Yoo, Singapore (SG); Byung-In Kwon, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 266 days.

(21) Appl. No.: 16/710,067

(22) Filed: Dec. 11, 2019

(65) Prior Publication Data

US 2020/0218144 A1    Jul. 9, 2020

Related U.S. Application Data

(60) Provisional application No. 62/779,527, filed on Dec. 14, 2018.

(51) Int. Cl.
*G03F 1/36*    (2012.01)
(52) U.S. Cl.
CPC ..................... *G03F 1/36* (2013.01)
(58) Field of Classification Search
CPC .......................................... G03F 1/36
USPC ............................................................ 430/5
See application file for complete search history.

(56) References Cited

U.S. PATENT DOCUMENTS

| | | | | |
|---|---|---|---|---|
| 6,420,077 B1* | 7/2002 | Chen | ......................... | G03F 1/36 430/30 |
| 6,660,436 B1* | 12/2003 | Chen | ......................... | G03F 1/72 430/5 |
| 6,993,455 B2* | 1/2006 | Koehle | ..................... | G03F 1/36 430/5 |

* cited by examiner

*Primary Examiner* — Christopher G Young
(74) *Attorney, Agent, or Firm* — ScienBiziP, P.C.

(57) ABSTRACT

A method of correcting a designed pattern of a photomask for fabricating a semiconductor device is provided. A substrate is provided. A first mask pattern of the photomask designed to form a first contact pattern on the substrate is conceived. The first mask pattern includes a plurality of mask holes each having a hole size. The first mask pattern is adjusted to expand the hole size along a horizontal direction and rotate the mask holes for conceiving a second mask pattern of the photomask designed to form a second contact pattern having a plurality of contact holes. A plurality of device gaps between the contact holes is verified, and an overlay margin between the second contact pattern and an adjacent pattern in the semiconductor device is verified for determining whether the second contact pattern is the designed pattern of the photomask.

10 Claims, 6 Drawing Sheets

CORRECTION METHOD OF PHOTOMASK PATTERN

CROSS-REFERENCE TO RELATED APPLICATION(S)

The present application claims the benefit of and priority to a provisional U.S. Patent Application Ser. No. 62/779,527, filed on Dec. 14, 2018, entitled "PHOTOMASK STRUCTURE AND METHOD FOR REDUCING OVERLAY ERROR", (hereinafter referred to as "US75638 application"). The disclosure of the US75638 application is hereby incorporated fully by reference into the present application.

FIELD

The present disclosure generally relates to a correction of a photomask pattern for fabricating a semiconductor device. More specifically, the present disclosure relates to a correction of a photomask pattern for fabricating a semiconductor device with a corrected photomask pattern.

BACKGROUND

Overlay control is critical in forming contact holes during photo-etching process in semiconductor manufacturing. Specifically, wafers are manufactured through a sequence of processes that each forms a pattern on the wafer to create various circuits with transistors, contacts, etc. To ensure functioning of all of the circuits, the patterns on the wafer must be aligned properly. In other words, contacts, lines and transistors on the wafer must be precisely lined up or overlapped with each other. Overlay control is referred to as the control of pattern-to-pattern alignment, and plays a critical role in monitoring layer-to-layer alignment on multi-layered semiconductor structures. Misalignment of the patterns may cause short circuits and connection failures, which in turn may impact fabrication yield and profit margins.

Overlay control has become increasingly more challenging due to the increase in pattern density and the reduction in pattern size on wafers. For example, small contact area of patterns increases overlay error (e.g., pattern is not properly aligned) and thus yields drop. Therefore, higher order overlay control is required to reduce the overlay errors. In other words, the overlay between two adjacent patterns needs to be precisely controlled.

SUMMARY

The present disclosure is directed to a method for correcting a designed pattern of a photomask for fabricating a semiconductor device and a method for fabricating a semiconductor device with a designed pattern of a photomask.

In a first aspect of the present application, a method for correcting a designed pattern of a photomask for fabricating a semiconductor device is provided. The method comprises providing a substrate of the photomask; conceiving a first mask pattern of the photomask designed to form a first contact pattern on the substrate, wherein the first mask pattern includes a plurality of mask holes each having a hole size; adjusting the first mask pattern to expand the hole sizes of the plurality of mask holes along a horizontal direction and to rotate the plurality of mask holes to conceive a second mask pattern of the photomask designed to form a second contact pattern having a plurality of contact holes; verifying a plurality of device gaps between the plurality of contact holes; and verifying an overlay margin between the second contact pattern and an adjacent pattern in the semiconductor device to determine the designed pattern of the photomask.

In a second aspect of the present application, a method for fabricating a semiconductor device with a designed pattern of a photomask is provided. The method comprises providing a substrate of the photomask; conceiving a first mask pattern of the photomask designed to form a first contact pattern on the substrate of the semiconductor device, wherein the first mask pattern includes a plurality of mask holes each having a hole size; adjusting the first mask pattern to expand the hole sizes of the plurality of mask holes along a horizontal direction and to rotate the plurality of mask holes to conceive a second mask pattern of the photomask designed to form a second contact pattern having a plurality of contact holes; verifying the plurality of contact holes of the second contact pattern; and photolithographing by using the second mask pattern of the photomask to generate a third contact pattern on the substrate.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

DETAILED DESCRIPTION

Figure 1:
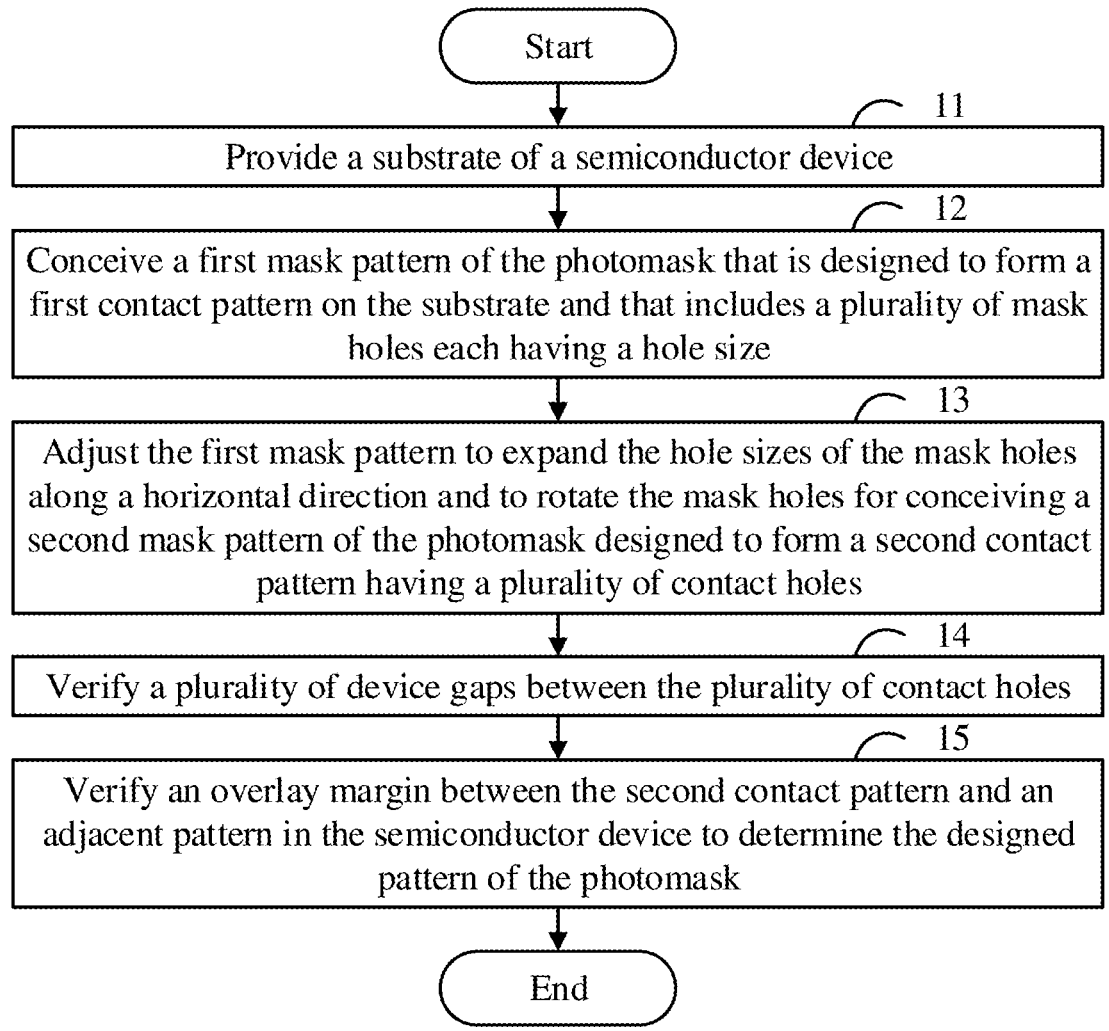
FIG. 1 illustrates a flowchart of an example correction method for correcting a designed pattern of a photomask for fabricating a semiconductor device, according to an example implementation of the present application.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments of the present disclosure in conjunction with the accompanying drawings in FIGS. 1 to 3B. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

FIG. 1 illustrates a flowchart of an example method for correcting a designed pattern of a photomask for fabricating a semiconductor device, according to an example implementation of the present application. The example method is provided by way of example only, as there are a variety of ways to carry out the method. Each block shown in FIG. 1 may represent one or more processes, methods, or subroutines, carried out in the example method. Furthermore, the order of blocks is illustrative only and may change. Additional blocks may be added or less blocks may be utilized without departing from the present disclosure.

At block 11, a substrate is provided. In at least one implementation, the substrate is provided for forming a plurality of circuits on the substrate to fabricate the semiconductor device.

At block 12, a first mask pattern of the photomask is conceived. In at least one implementation, the first mask pattern includes a plurality of mask holes and is designed to form a first contact pattern on the substrate. In at least one implementation, each of the mask holes has a hole size.

Figure 2A:
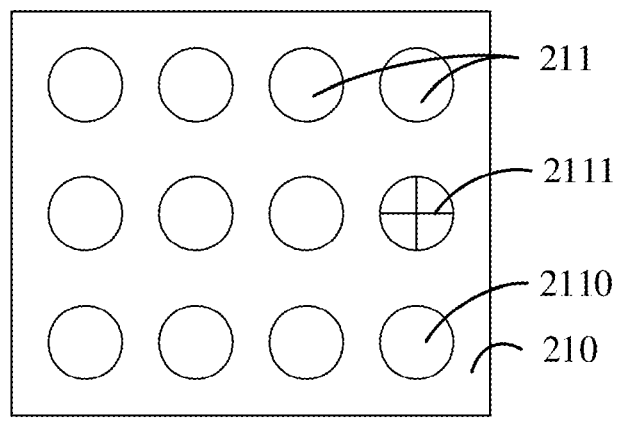
FIGS. 2A-2C are schematic illustrations of a mask pattern of a photomask and a corresponding contact pattern of a wafer, according to example implementations of the present application.
Figure 2B:
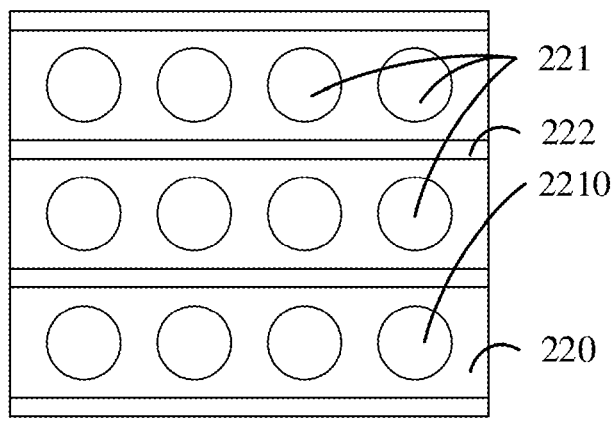
Figure 2C:
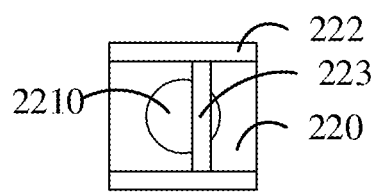

FIGS. 2A-2C are schematic illustrations of a mask pattern of a photomask and a corresponding contact pattern of a wafer, according to example implementations of the present application. In FIG. 2A, the first mask pattern 211 of the photomask 210 may include the mask holes 2110. In at least one implementation, the mask holes 2110 may be a plurality of circular holes, and the hole sizes may be determined based a mask radius 2111 of the circular holes. In FIG. 2B, a wafer 220 may be patterned by using the photomask 210 to form the first contact pattern 221 including a plurality of first patterned contacts 2210. In at least one implementation, the first patterned contacts may be a plurality of circular contacts that each has a contact radius (e.g., when the mask holes are circular holes). In at least one implementation, the first patterned contacts 2210 may be lined up along a plurality of hole lines, and each of the hole lines may be separated by one of a plurality of channels 222. In at least one implementation, the channels 222 may be a plurality of buried channel array transistors. In at least one implementation, each of the first patterned contacts 2210 may not be in contact with the channels 222. In FIG. 2C, the first patterned contacts 2210 of the first contact pattern 221 may overlap with an adjacent pattern 223. When a contact size of the first patterned contacts 2210 is reduced, an overlay margin between the first contact pattern 221 and the adjacent pattern 223 may be decreased. Thus, a misalignment between the first contact pattern 221 and the adjacent pattern 223 may be generated when the contact size of the first patterned contacts 2210 is reduced. In at least implantation, the first mask pattern 211 of the photomask 210 may be adjusted to prevent the misalignment.

Returning to FIG. 1, at block 13, the first mask pattern is adjusted to expand the hole sizes of the mask holes along a horizontal direction and to rotate the mask holes for conceiving a second mask pattern of the photomask. In at least one implementation, the second mask pattern is designed to form a second contact pattern on the substrate. In at least one implementation, the second contact pattern includes a plurality of contact holes.

Figure 3A:
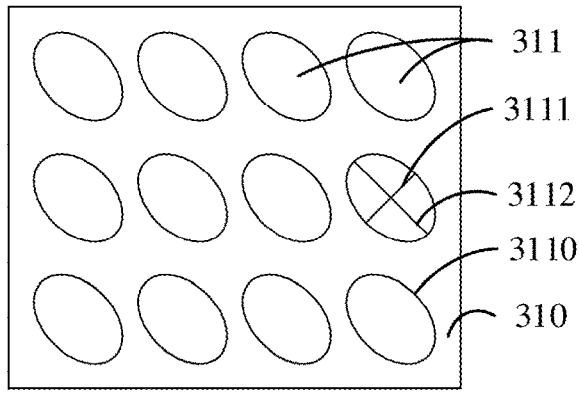
FIGS. 3A-3D are schematic illustrations of a mask pattern of a photomask and a corresponding contact pattern of a wafer, and two improper patterns of the wafer, according to example implementations of the present application.

FIGS. 3A-3D are schematic illustrations of a mask pattern of a photomask and a corresponding contact pattern of a wafer, and two improper patterns of the wafer, according to example implementations of the present application. In FIG. 3A, the second mask pattern 311 of the photomask 310 may include a plurality of rotated holes 3110. In at least one implementation, the rotated holes 3110 may be generated by performing an optical proximity correction (OPC) to expand the mask holes 2110 (shown in FIG. 2A) along a horizontal direction and to horizontally rotate the expanded mask holes. In at least one implementation, the OPC may be a photolithography enhancement method for compensating image errors resulted from diffraction or process effects. In at least one implementation, the OPC corrects image errors by modifying the pattern on the photomask. The process may be performed according to pre-computed look-up tables calculated based on width and space between features or by using simulation models to identify the optimal solution of the final patterns.

In at least one implementation, the rotated holes 3110 may be a plurality of elliptical holes, and each of the rotated holes 3110 may have an original length 3111 and an expanded length 3112. In at least one implementation, the expanded length 3112 may be determined based on a semi-major axis of the elliptical holes. In at least one implementation, the rotated holes 3110 may be regarded as a plurality of horizontally tilted holes, and a first rotating angle for horizontally rotating the expanded mask holes may be within a range from 30 degrees to 60 degrees. In at least one implementation, a direction of a rotation axis of the horizontal rotation may be similar to a normal direction of the photomask 310. In at least one implementation, the direction of the axis of the horizontal rotation may be identical to the normal vector of the photomask 310.

Figure 3B:
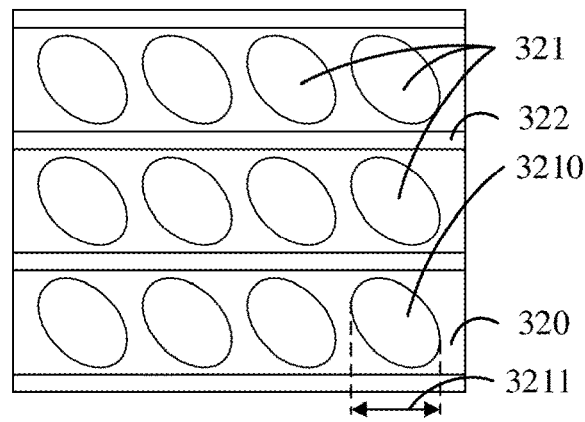

Referring to FIG. 3B, a wafer 320 may be patterned by using the photomask 310 to form the second contact pattern 321 including a plurality of second patterned contacts 3210. In at least one implementation, the second patterned contacts 3210 may be lined up along a plurality of hole lines, and the hole lines may be separated by a plurality of channels 322. In at least one implementation, each of the second patterned contacts 3210 may not be in contact with the channels 322. In at least one implementation, a horizontal width 3211 of the second patterned contacts 3210 may be still wider than the contact radius of the first patterned contacts 2210, although the second patterned contacts 3210 may be only expanded along the semi-major axis of the elliptical holes. Thus, the overlay margin between the second contact pattern 321 and the adjacent pattern 223 may be increased since the horizontal width 3211 may be wider than a contact diameter of the first patterned contacts 2210.

Figure 3C:
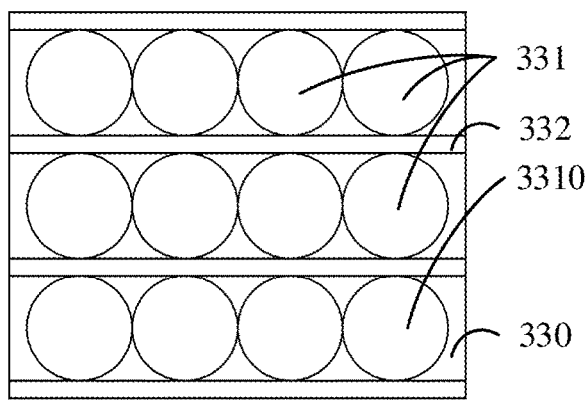
Figure 3D:
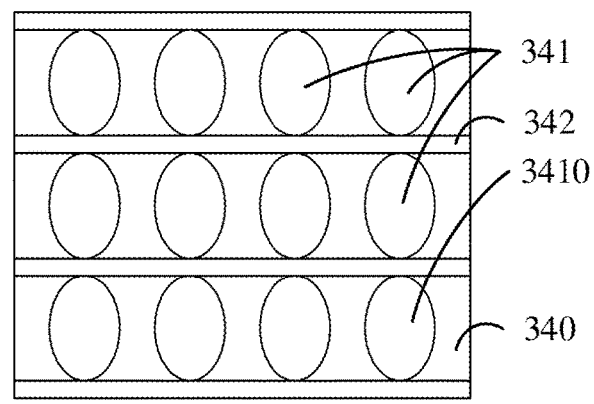

Referring to FIG. 3C, a wafer 330 may be patterned by using a first improper photomask to form a first improper pattern 331 including a plurality of first expanded contacts 3310 when the first improper photomask includes a plurality of expanded circular holes. In at least one implementation, the first expanded contacts 3310 may be in contact with each other. Thus, a short circuit between the expanded contacts 3310 may be generated due to an overlay error. In at least one implementation, the expanded contacts 3310 may be in contact with a plurality of channels 332. Thus, a short circuit between the expanded contacts 3310 and the channels 332 may be generated due to the overlay error. Referring to FIG. 3D, a wafer 340 may be patterned by using a second improper photomask to form a second improper pattern 341 including a plurality of second expanded contacts 3410 when the second improper photomask includes a plurality of unrotated elliptical holes. In at least one implementation, the second expanded contacts 3410 may be in contact with a plurality of channels 342, which may result in generating a short circuit (e.g., due to the overlay error). In at least one implementation, a size of the rotated holes 3110 of the photomask 310 may be identical to the size of the unrotated elliptical holes of the second improper photomask. However, the rotated holes 3110 of the photomask 310 may be separated from the channel 342 to prevent the overlay error since the rotated holes 3110 of the photomask 310 are rotated horizontally.

Figure 4A:
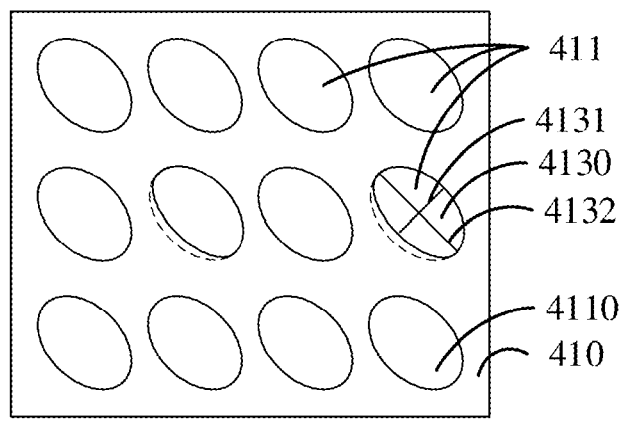
FIGS. 4A-4B are schematic illustrations of a mask pattern of a photomask and a corresponding contact pattern of a wafer, according to example implementations of the present application.
Figure 4B:
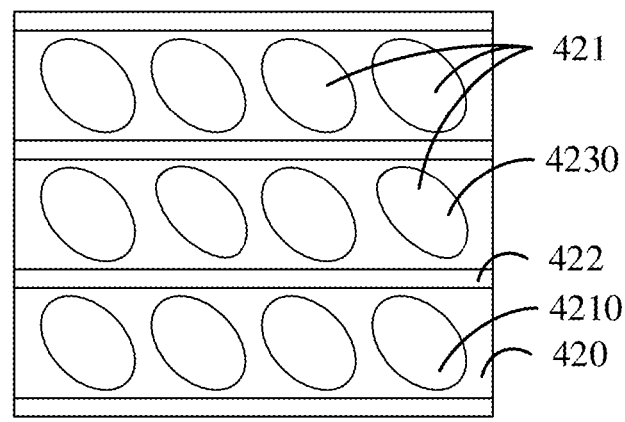

FIGS. 4A-4B are schematic illustrations of a mask pattern of a photomask and a corresponding contact pattern of a wafer, according to example implementations of the present application. In FIG. 4A, the second mask pattern 411 of the photomask 410 may include the rotated holes 4110 and at least one vertically tilted hole 4130. In at least one implementation, the rotated holes 4110 may be generated by performing the OPC to expand the mask holes 2110 (shown in FIG. 2A) along a horizontal direction and horizontally rotate the expanded mask holes. In at least one implementation, at least one of the rotated holes 4110 may be further vertically rotated to generate the at least one vertically tilted hole 4130 by performing the OPC. In at least one implementation, the remaining rotated holes 4110 may remain unchanged. In at least one implementation, the at least one vertically tilted holes 4130 may have a shortened length 4131 and an expanded length 4132. In at least one implementation, the shortened length 4131 may be shorter than the original length 3111 (shown in FIG. 3A), and the expanded length 4132 may be identical to, or shorter than, the expanded length 3112.

In at least one implementation, a second rotating angle for vertically rotating the at least one rotated hole 4110 may be within a range from 30 degrees to 60 degrees. In at least one implementation, a direction of the axis of the vertical rotation may be perpendicular to a normal vector of the photomask 410. In at least one implementation, each of the vertically tilted holes 4130 may be sandwiched between two of the remaining rotated holes 4110.

Referring to FIG. 4B, a wafer 420 may be patterned by using the photomask 410 to form the second contact pattern 421 including a plurality of second patterned contacts 4210 and at least one third patterned contact 4230. In at least one implementation, a horizontal width of the at least one third patterned contact 4230 may be shorter than the horizontal width 3211 of the second patterned contacts 3210 for preventing the second patterned contacts 4210 and the at least one third patterned contact 4230 from overlapping each other. In at least one implementation, the overlay margin between the second contact pattern 421 and the adjacent pattern 223 (shown in FIG. 2C) may be increased, since the horizontal widths of the second patterned contacts 4210 and the at least one third patterned contact 4230 may be wider than the contact diameter of the first patterned contacts 2210.

Figure 5A:
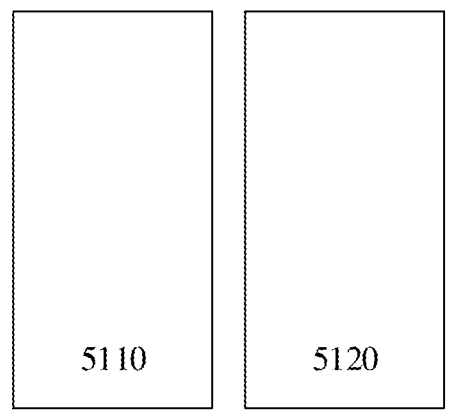
FIGS. 5A-5C are schematic illustrations of cross-sectional views of rotated holes and a vertically tilted hole, according to example implementations of the present application.
Figure 5B:
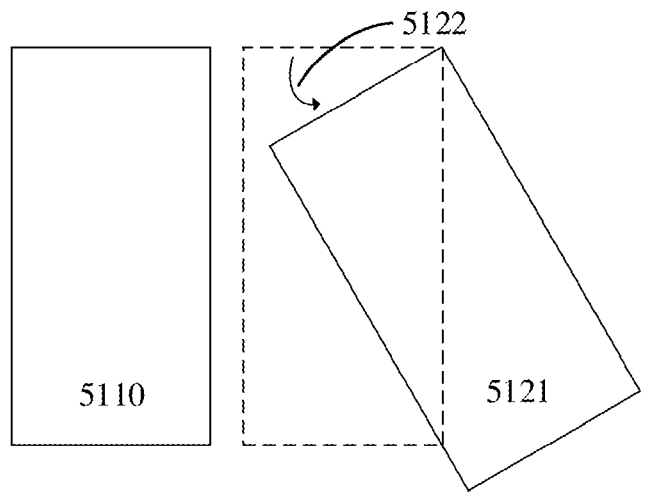
Figure 5C:
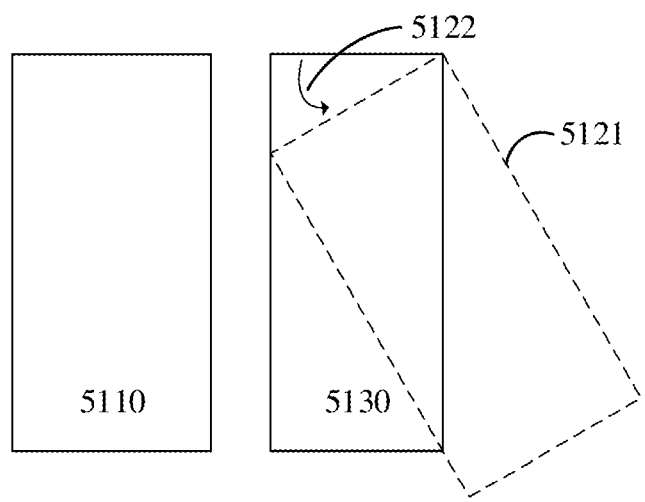

FIGS. 5A-5C are schematic illustrations of cross-sectional views of rotated holes and a vertically tilted hole, according to example implementations of the present application. In FIG. 5A, two rotated holes 5110 and 5120 adjacent to each other may be generated when the mask holes 2110 are expanded along the horizontal direction and horizontally rotated. In at least one implementation, the rotated hole 5120 may be vertically rotated by performing the OPC to conceive the second mask pattern having a vertically tilted hole 5130 in FIG. 5C. In at least one implementation, the rotated hole 5120 may be vertically rotated through a rotating angle 5122 to generate an intermediate hole 5121 in FIG. 5B. Thus, the vertically tilted hole 5130 may be determined based on the intermediate hole 5121 and the rotated hole 5120. In at least one implementation, the distance between the rotated hole 5110 and the vertically tilted hole 5130 may be wider than the distance between the two rotated holes 5110 and 5120.

Returning to FIG. 1, at block 14, a plurality of device gaps between the plurality of contact holes is verified. In at least one implementation, the device gaps may be verified to prevent the plurality of contact holes from overlapping each other when the contact holes are formed on the substrate by the mask pattern of the photomask. In at least one implementation, the device gaps may be verified by an observation equipment to check whether there are two of the contact holes overlapping each other. In at least one implementation, the observation equipment may be a scanning electron microscope (SEM). In at least one implementation, a first device gap between a specific one of the at least one third patterned contact 4230 and a specific one of the second patterned contacts 4210 adjacent to the specific third patterned contact 4230 may be wider than a second device gap between two of the second patterned contacts 4210 adjacent to each other.

At block 15, an overlay margin between the second contact pattern 321 and the adjacent pattern 223 in the semiconductor device may be verified to determine the designed pattern of the photomask. In at least one implementation, the overlay margin may be verified for controlling an overlapping between the second contact pattern and the adjacent pattern. In at least one implementation, the overlay margin may be verified to check whether the second contact pattern 321 and the adjacent pattern 223 are precisely lined up or overlapped with each other.

In at least one implementation, the semiconductor device may be a memory. In at least one implementation, the semiconductor device may be a dynamic random-access memory (DRAM). In at least one implementation, the second patterned contacts 3210 may be a plurality of data line contacts, the adjacent pattern may be a data line pattern, and the channels 322 may be a plurality of buried channel array transistors (BCATs). In at least one implementation, the data line contacts may be separated from each other and separated from the BCATs, and the data line contacts may be precisely lined up or overlapped with the data line pattern.

Figure 6:
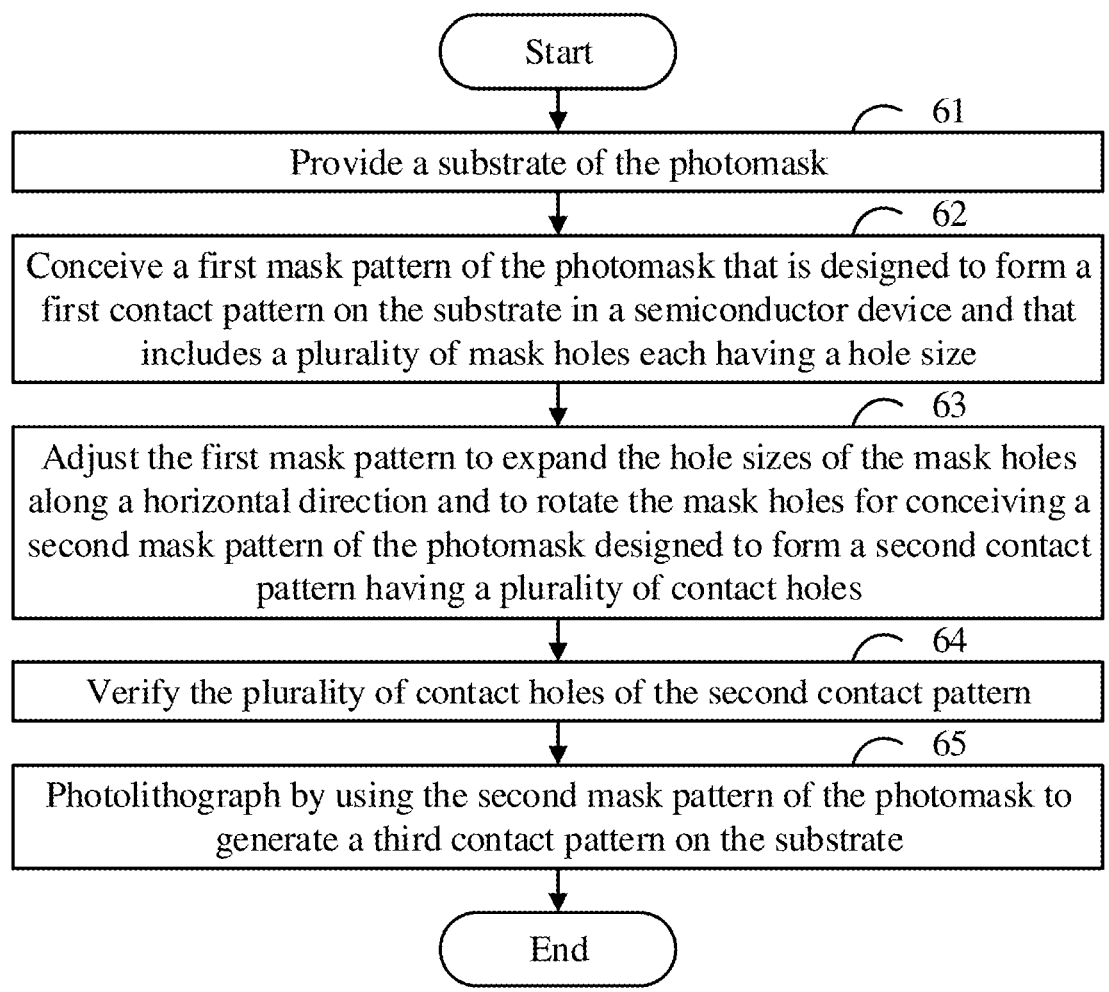
FIG. 6 illustrates a flowchart of an example fabrication method for fabricating a semiconductor device with a designed pattern of a photomask, according to an example implementation of the present application.

FIG. 6 illustrates a flowchart of an example method for fabricating a semiconductor device with a designed pattern of a photomask, according to an example implementation of the present application. The example method is provided by way of example only, as there are a variety of ways to carry out the method. Each block shown in FIG. 1 may represent one or more processes, methods, or subroutines, carried out in the example method. Furthermore, the order of blocks is illustrative only and may change. Additional blocks may be added or less blocks may be utilized without departing from the present disclosure.

At block 61, a substrate is provided. In at least one implementation, the substrate is provided for forming a plurality of circuits on the substrate to fabricate the semiconductor device.

At block 62, a first mask pattern of the photomask is conceived. In at least one implementation, the first mask pattern that includes a plurality of mask holes and is designed to form a first contact pattern on the substrate in the semiconductor device. In at least one implementation, each of the mask holes has a hole size.

At block 63, the first mask pattern is adjusted to expand the hole sizes of the mask holes along a horizontal direction and to rotate the expanded mask holes for conceiving a second mask pattern of the photomask. In at least one implementation, the second mask pattern is designed to form a second contact pattern on the substrate. In at least one implementation, the second contact pattern includes a plurality of contact holes.

In at least one implementation, at least one of the mask holes may be further vertically rotated for conceiving the second mask pattern including at least one vertically tilted hole, after the mask holes may be expanded along the horizontal direction and horizontally rotated.

At block 64, the contact holes of the second contact pattern may be verified. In at least one implementation, a plurality of device gaps between the plurality of contact holes may be verified. In at least one implementation, the device gaps may be verified to prevent the plurality of contact holes from overlapping each other. In at least one implementation, an overlay margin between the second contact pattern and the adjacent pattern in the semiconductor may be verified to determine the designed pattern of the photomask. In at least one implementation, the overlay margin may be verified to check whether the second contact pattern and the adjacent pattern are precisely lined up or overlapped each other.

At block 65, a third contact pattern may be generated on the substrate by photolithographing via the second mask pattern of the photomask. In at least one implementation, an adjacent pattern may be generated on the third contact pattern of the substrate to generate the semiconductor device.

In at least one implementation, the semiconductor device may be a memory. In at least one implementation, the semiconductor device may be a DRAM. In at least one implementation, the second patterned contacts may be a plurality of data line contacts, the adjacent pattern may be a data line pattern, and the channels may be a plurality of BCATs. In at least one implementation, the data line contacts may be separated from each other and separated from the BCATs, and the data line contacts may be precisely lined up or overlapped with the data line pattern.

The embodiments shown and described above are only examples. Many details are often found in the art such as the other features of the photomask. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of correcting a designed pattern of a photomask for fabricating a semiconductor device, the method comprising:
   providing a substrate of the photomask;
   conceiving a first mask pattern of the photomask designed to form a first contact pattern on the substrate, wherein the first mask pattern includes a plurality of mask holes each having a hole size;
   adjusting the first mask pattern to expand the hole sizes of the plurality of mask holes along a horizontal direction and to rotate the plurality of mask holes to conceive a second
   mask pattern of the photomask designed to form a second contact pattern having a plurality of contact holes;
   verifying a plurality of device gaps between the plurality of contact holes; and
   verifying an overlay margin between the second contact pattern and an adjacent pattern in the semiconductor device to determine the designed pattern of the photomask.

2. The method according to claim 1, wherein each of the plurality of mask holes is a circular hole, and the hole size is determined based on a mask radius of the circle holes.

3. The method according to claim 1, wherein the plurality of mask holes is adjusted to be a plurality of elliptical holes when the hole sizes of the plurality of mask holes are expanded long the horizontal direction to generate a semi-major axis for each of the plurality elliptical holes by performing an optical proximity correction.

4. The method according to claim 3, further comprising:
   rotating horizontally the plurality of elliptical holes by performing the optical proximity correction to generate a plurality of horizontally tilted holes for conceiving the second mask pattern to increase the overlay margin.

5. The method according to claim 4, further comprising:
   rotating vertically at least one of the plurality of horizontally tilted holes by performing the optical proximity correction to generate a plurality of vertically tilted holes, wherein the remaining horizontally tilted holes remain unchanged, and conceiving the second mask pattern based on the plurality of vertically tilted holes and the remaining horizontally tilted holes.

6. The method according to claim 5, wherein a first one of the plurality of device gaps between a specific one of the vertically tilted holes and one of the remaining horizontally tilted holes adjacent to the specific vertically tilted hole is wider than a second one of the plurality of device gaps between two of the remaining horizontally tilted holes adjacent to each other.

7. The method according to claim 5, wherein each of the vertically tilted holes is sandwiched between two of the remaining horizontally tilted holes.

8. The method according to claim 1, wherein the plurality of device gaps is verified to prevent the plurality of contact holes from overlapping each other.

9. The method according to claim 1, wherein the overlay margin is verified for controlling an overlapping between the second contact pattern and the adjacent pattern.

10. The method according to claim 1, further comprising:
   photolithographing by using the second mask pattern of the photomask to generate a third contact pattern on the substrate.

\* \* \* \* \*